United States Patent
Massengill et al.

(10) Patent No.: US 7,239,223 B2
(45) Date of Patent: Jul. 3, 2007

(54) ENHANCEMENT MAGNETIZER FOR MAGNETIC RESONANCE IMAGING SCREENING

(75) Inventors: R. Kemp Massengill, Leucadia, CA (US); Frederick J. Jeffers, Escondido, CA (US)

(73) Assignee: MedNovus, Inc., Leucadia, CA (US)

( * ) Notice: Subject to any disclaimer, the term of this patent is extended or adjusted under 35 U.S.C. 154(b) by 310 days.

(21) Appl. No.: 11/008,579

(22) Filed: Dec. 8, 2004

(65) Prior Publication Data

US 2006/0084857 A1    Apr. 20, 2006

Related U.S. Application Data

(60) Provisional application No. 60/620,082, filed on Oct. 18, 2004.

(51) Int. Cl.
*H01F 13/00* (2006.01)
*H01H 7/20* (2006.01)

(52) U.S. Cl. ........................ 335/284; 600/410

(58) Field of Classification Search ............... 600/9, 600/15, 407, 409, 410, 424; 335/284
See application file for complete search history.

(56) References Cited

U.S. PATENT DOCUMENTS

| | | |
|---|---|---|
| 3,781,664 A | 12/1973 | Rorden |
| 3,971,983 A | 7/1976 | Jaquet |
| 4,060,039 A | 11/1977 | Lagarrigue |
| 4,068,164 A | 1/1978 | Schwartz et al. |
| 4,193,024 A | 3/1980 | Hoult et al. |
| 4,734,643 A | 3/1988 | Bubenik et al. |
| 4,837,489 A | 6/1989 | McFee |
| 5,321,361 A | 6/1994 | Goodman |
| 5,379,334 A | 1/1995 | Zimmer et al. |
| 5,408,178 A | 4/1995 | Wikswo, Jr. et al. |
| 5,493,517 A | 2/1996 | Frazier |
| 5,494,033 A | 2/1996 | Buchanan et al. |
| 5,494,035 A | 2/1996 | Leuthold et al. |
| 5,504,428 A | 4/1996 | Johnson |
| 5,610,518 A | 3/1997 | Chamberlain, IV |
| 5,689,184 A | 11/1997 | Jeffers et al. |
| 5,705,924 A | 1/1998 | Jeffers |
| 5,735,278 A | 4/1998 | Hoult et al. |
| 5,757,183 A | 5/1998 | Smith et al. |
| 5,842,986 A | 12/1998 | Avrin |
| 6,064,208 A | 5/2000 | Steckner |
| 6,087,832 A | 7/2000 | Doty |

(Continued)

FOREIGN PATENT DOCUMENTS

WO    WO 03/091753 A1    11/2003
WO    WO 2004/044620 A1    5/2004

OTHER PUBLICATIONS

ETS-Lindgren Website; *Ferromagnetic Detection System*; May 29, 2004; 2 pages.

(Continued)

*Primary Examiner*—Ramon M. Barrera
(74) *Attorney, Agent, or Firm*—Gerald W. Spinks (57) ABSTRACT

A method and apparatus for enhancing detection of a ferromagnetic threat object by magnetizing the threat object with a separate magnetic field, prior to scanning of the subject by a ferromagnetic-detecting sensor system.

8 Claims, 5 Drawing Sheets

U.S. PATENT DOCUMENTS

| | | | |
|---|---|---|---|
| 6,133,829 | A | 10/2000 | Johnstone et al. |
| 6,150,810 | A | 11/2000 | Roybal |
| 6,208,884 | B1 | 3/2001 | Kumar et al. |
| 6,362,739 | B1 | 3/2002 | Burton |
| 6,384,603 | B2 | 5/2002 | Hoult et al. |
| 6,418,335 | B2 | 7/2002 | Avrin et al. |
| 6,541,966 | B1 | 4/2003 | Keene |
| 2002/0115925 | A1 | 8/2002 | Avrin et al. |
| 2002/0151779 | A1 | 10/2002 | Avrin et al. |
| 2003/0083588 | A1 | 5/2003 | McClure et al. |
| 2003/0171669 | A1 | 9/2003 | Kopp |
| 2003/0216632 | A1 | 11/2003 | McClure et al. |
| 2004/0135687 | A1 | 7/2004 | Keene |
| 2004/0147833 | A1 | 7/2004 | Czipott et al. |
| 2004/0147834 | A1 | 7/2004 | Czipott et al. |
| 2004/0169509 | A1 | 9/2004 | Czipott et al. |
| 2004/0189293 | A1 | 9/2004 | Czipott et al. |

OTHER PUBLICATIONS

ETS-Lindgren; *Ferroguard Unveiled at RSNA 2003*; The Quiet Zone; Jan. 2004; p. 11.

Finn, Edward J., et al., *Ferromagnetic Materials in Patients: Detection Before MR Imaging*; Radiology; Jul. 1985; vol. 185; pp. 139-141.

Institute for Biodiagnostics; *MRI Safety: Detection of Ferromagnetic Objects*; Date unknown; 8 pages; National Research Council Canada, no date.

Kopp Development; Ferralert Brochure; Date Unknown; 2 pages; Kopp Development; Jensen Beach, FL, no date.

Kotter, David K., et al..; Abstract: *Detection and Classification of Concealed Weapons Using a Magnetometer-based Portal*; NASA ADS Instrumentation Abstract Service; Aug. 2002; 1 page; The International Society for Optical Engineering.

*Melodi Metal Locator Gets Straight to the Point*; Medica 2002; Nov. 2002; 4 pages; Düsseldorf, Germany.

*Metal Detector Finds Lost Coins in Kids*; CNN.com/TECHNOLOGY; Jan. 29, 2003;2 pages; Cable News Network.

Quantum Magnetics; i-Portal 100 Advanced Weapons Detection Portal Brochures; Date unknown; 8 pages, no date.

CMP United Business Media Website; Metal detector guards the door to screen ferromagnetic objects; Diagnostic Imaging Scan; Jan. 28, 2004; 2 pages.

ENHANCEMENT MAGNETIZER FOR MAGNETIC RESONANCE IMAGING SCREENING

CROSS REFERENCE TO RELATED APPLICATIONS

This application relies upon U.S. Provisional Patent Application No. 60/620,082, filed on Oct. 18, 2004, and entitled "Enhancement Magnetizer for Magnetic Resonance Imaging Screening."

STATEMENT REGARDING FEDERALLY SPONSORED RESEARCH OR DEVELOPMENT

Not Applicable

BACKGROUND OF THE INVENTION

1. Field of the Invention

This invention is in the field of screening devices for preventing ferromagnetic or magnetic metal objects from being in the vicinity of an operating magnetic resonance imaging apparatus.

2. Background Art

Magnetic resonance imaging (MRI) has been called "the most important development in medical diagnosis since the discovery of the x-ray" 100 years ago. Magnetic resonance imaging has significant risks, however, and these are becoming more apparent as the number of MRI procedures increases dramatically. In particular, ferromagnetic objects are drawn toward the magnetic resonance imaging magnet by the strong magnetic field of the magnet, sometimes with catastrophic results. This attraction of ferromagnetic objects to the MRI magnet is termed the "missile threat." Not only have there been numerous injuries to patients, including one tragic death, but damage to the MRI magnet itself is also a significant problem.

In an effort to provide safety, MRI centers have attempted to utilize conventional metal detectors, such as those used for airport and other security applications. Conventional metal detectors alarm not only on ferromagnetic threat objects, but also on non-threat, non-ferromagnetic, metallic objects. The huge number of false positive alarms generated by conventional metal detectors has caused such consternation for MRI staff technicians that conventional metal detectors have been abandoned for this application. Indeed, conventional metal detectors may have no current usefulness as a practical solution for MRI safety.

A ferromagnetic object, such as a small pipe wrench, can be drawn in instantaneous missile-like fashion toward the MRI magnet. The force of the magnetic attraction between the pipe wrench and the MRI magnet causes the wrench to fly toward the magnet as if propelled by a rocket. A tragic death has occurred from the missile threat, and many "near misses" have occurred. One MRI disaster involved a bobby pin being impaled in the nasal passages of a patient, requiring surgical extirpation.

Magnifying the threat potential for serious harm is the next generation of MRI magnets, which are even more powerful than current generations, generating magnetic fields of 3.0 Tesla, or 30,000 Gauss, as opposed to today's "standard" of 1.5 Tesla, or 15,000 Gauss.

Magnetic Resonance Imaging (MRI) scanners utilize extremely high magnetic fields. It is well known that very serious accidents can occur if ferromagnetic objects are carried into the vicinity of an MRI scanner. To minimize this danger, ferromagnetic-detecting portal inventions and ferromagnetic-detecting wand inventions have been developed to detect ferromagnetic threat objects in the magnetic resonance imaging environment, and so minimize the chance of dangerous accidents.

Ordinary ferromagnetic objects are only magnetic if a magnetic field is applied. A portal can create such a magnetic field by using current flowing in coils or by using permanent magnets. This applied field magnetizes the ferromagnetic threat, which can then be detected by the sensor system of the portal. The fringe field of the MRI magnet can also be used as the applied field.

Another type of portal is "passive," meaning that it has no independent applied magnetic field source, but rather depends upon the 0.5 Oersted (Oe) field of the earth for magnetization of a ferromagnetic threat object. This small field is generally adequate for ordinary "soft" iron or steel objects, like a carpenter's nail, which are easily magnetized.

However, some common ferromagnetic objects are made of tempered spring steel. The ordinary "bobby pin" used in women's hair is a good example. The magnetic properties of such materials make them hard to magnetize and they are, therefore, called "magnetically hard." FIG. 1 below shows the initial magnetization curve of a typical bobby pin.

Figure 1:
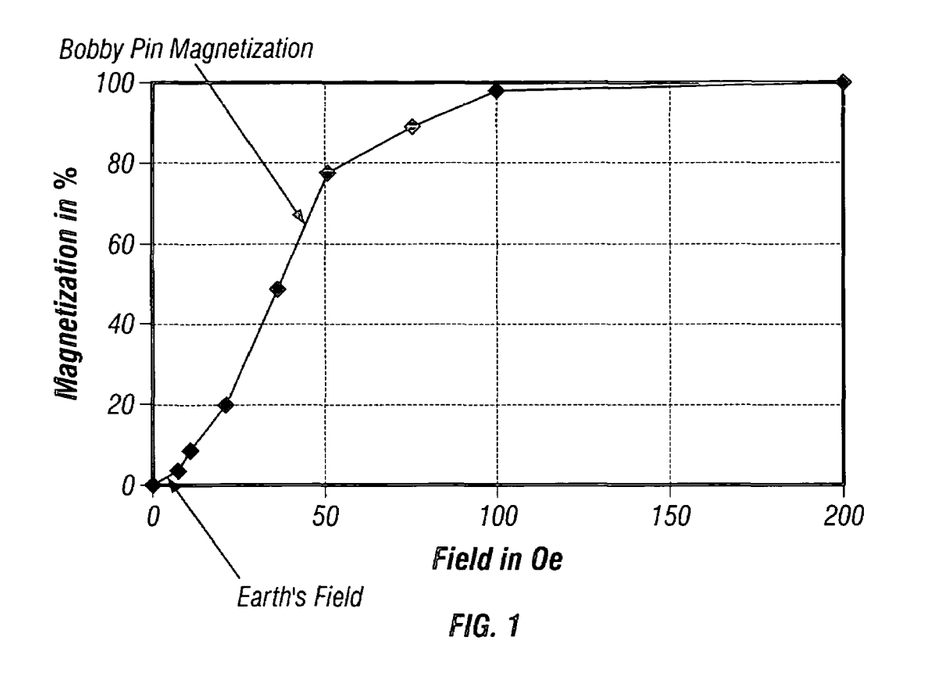
FIG. 1 is a graph of the initial magnetization curve of a bobby pin.

As can be seen from FIG. 1, an applied field higher than 100 Oe is required to achieve a magnetization of 98%, and a field higher than 50 Oe is needed to achieve a magnetization of 80%. The applied field in a 1.5 Tesla MRI apparatus is 15,000 Oe, which is sufficient to create a missile threat with even a magnetically hard object. So, tempered steel or other magnetically hard objects like bobby pins are just as dangerous as ordinary soft steel items, from the missile threat point of view, and it is important that these be detected.

Some types of magnetic fields are insufficient to magnetize certain ferromagnetic threat objects, including bobby pins and the like, for detection by a ferromagnetic-detecting portal or a ferromagnetic-detecting wand. For example, in the very small 0.5 Oe magnetic field of the earth, the magnetization of the bobby pin is virtually zero, as shown by the arrow in FIG. 1. In addition, the earth's magnetic field for a particular location on the planet is in only one axis, and detection can be missed when the major axis of a ferromagnetic threat is perpendicular to the earth's magnetic field. This means that a bobby pin would be very poorly detected, if at all, by a passive portal that depended on the earth's field to magnetize the objects being detected.

As a further example, the magnetic fringing field of the MRI magnet is generally only 1 to 5 Oe outside the MRI magnet room itself. In addition, the MRI fringing field does not apply magnetization in all three axes, and, if the threat object is perpendicular to the fringing magnetic field, detection is often compromised because of insufficient magnetization.

As a final example, the permanent magnets or coil arrangements of a strength typically found on an "active" portal or wand may be insufficient to magnetize certain difficult-to-magnetize ferromagnetic objects, such as bobby pins. Also, the excitation magnetic field associated with a portal with its own applied magnetic field system is often applied in less than all three (x, y, and z) axes, since it is impossible to apply a magnetic field in all three axes when the field source and the detection point are stationary. This can result in insufficient magnetization, especially of difficult-to-magnetize ferromagnetic threat objects. For instance, if an applied field is only applied to provide detection of a threat for the x axis, it is possible that a threat may escape detection because of insufficient magnetization for the y axis and the z axis. The inability to apply the magnetic field in all three axes can be partially overcome, however, if the applied magnetic field strength in one axis is sufficiently great to induce magnetization sufficient to allow detection. Further, the chance of detecting a threat object in such a portal is increased if the subject is asked to rotate or tilt within the portal pass-through aperture.

There may be additional reasons for insufficient magnetization to support detection of a threat object. The object may be tiny, or the configuration of the object may make magnetization, and hence, detection, difficult. For instance, a round object is more difficult to magnetize and detect than an elongated one. Further, the ferromagnetic threat object may be located toward the midline of the portal's pass-through aperture, such as in the middle of a 32 inch portal aperture, or 16 inches away from the sides of the portal. Or, the threat object may be located at too great a distance from a ferromagnetic-detecting wand, such as when the wand is waved at too great a distance from the threat object to achieve the required magnetization.

In any of the above instances, as well as others, the result is insufficient magnetization to allow the sensing system of the portal or wand apparatus to detect the threat, resulting in a false negative (missed) response. Then, when the patient enters the magnetic resonance magnet room, disaster can strike, as the ferromagnetic threat now becomes completely magnetized by the considerably more powerful MRI magnet and, when the critical point is reached in relation to the distance to the MRI magnet, the threat object is propelled toward the magnet as if propelled by a rocket.

BRIEF SUMMARY OF THE INVENTION

Objects made of tempered steel, like bobby pins, retain a good deal of their magnetization after being exposed to a relatively high magnetic field. For example, a bobby pin retains about 50% of its magnetization after the application of a 100 Oe field. That makes it relatively easy to detect with a magnetic sensor.

The present invention provides an apparatus and method to ensure that ferromagnetic threats, including such magnetically hard ferromagnetic threats as bobby pins and the like, are sufficiently magnetized, via the application of a magnetic field of suitable strength, to support detection by a ferromagnetic-detecting portal or by a ferromagnetic-detecting wand.

The present invention achieves at least two fundamental advantages. First, the ferromagnetic threat object is better magnetized by the present invention than the magnetization possible from the earth's magnetic field or from the fringing field outside the magnet room, and the ferromagnetic threat object will be better magnetized by the present invention than by the applied field sources found in some portals. The principle reason for this improved magnetization is that the magnetic source for the applied field is much closer to a potential threat object. With a 32 inch portal aperture, for instance, a ferromagnetic threat in the center of the aperture is at least 16 inches away from the magnetizing source on the sides of the portal. On the other hand, with the present invention, the magnetizing source can be positioned in very close proximity to the ferromagnetic threat object. Specifically, for example, the present invention makes it possible to bring the magnetizer within two to three inches of a bobby pin, or even closer in some cases. This proximity is impossible with a person passing through the center of a 32 inch pass-through portal, which can place the threat object as far as 16 inches away from the magnetizing source.

The second fundamental advantage of the present invention is that magnetization can occur in all three (x, y, and z) axes. This is accomplished according to the present invention by positioning the magnetizer appropriately on all three axes around a ferromagnetic threat object. This can be done with a hand held magnet. Where scanning of a person's head is desired, to detect a threat object such as a bobby pin, for instance, magnetization can be achieved according to the present invention by placing the subject's head into a helmet-like structure. In this embodiment, the helmet can incorporate magnetic means, and the method of applying the helmet can be designed to magnetize any threat object in three axes. In either embodiment, the method and apparatus of the present invention solve the problem of magnetizing in only one axis, as a magnetic field can be easily and readily applied in all three axes.

The novel features of this invention, as well as the invention itself, will be best understood from the attached drawings, taken along with the following description, in which similar reference characters refer to similar parts, and in which:

DETAILED DESCRIPTION OF THE INVENTION

Figure 2:
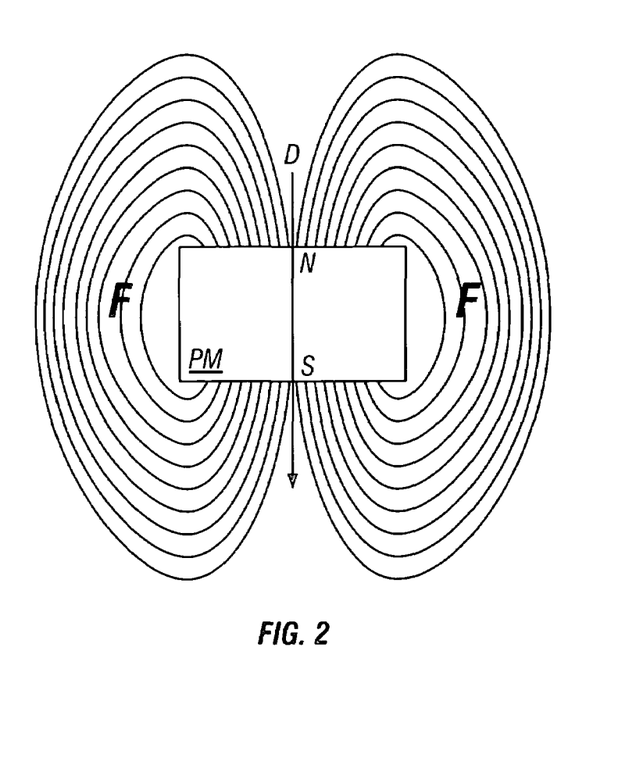
FIG. 2 is a schematic view of a magnetic field generated by a permanent magnet.

The apparatus of the present invention is a magnetizer which is introduced to the desired area near a portion of a prospective human subject requiring pre-MRI screening. A very important area of magnetization is the hair and head area in a search for difficult to find ferromagnetic threats, such as bobby pins. On the other hand, it is not nearly as critical to apply enhanced magnetization to the knee area, because a retained ferromagnetic object in the knee is quite likely to be encased in fibrous tissues, which bind down the object, thus preventing or severely limiting its propulsion toward the MRI magnet during the imaging procedure. In addition to the head area, other areas of the body, such as the pocket areas, the shoes, or the waist area, can also be mapped in a three-axis fashion as desired by a hand-held permanent magnet magnetizer. The preferred magnetizer embodiment is a permanent magnet configuration, which can be incorporated in a hand-held permanent magnet or another configuration. FIG. 2 shows a permanent magnet PM, with magnetic field lines F, and the vector axis indicating the direction D of magnetization. Magnetic north and south are designated as N and S, respectively.

Figure 3A:
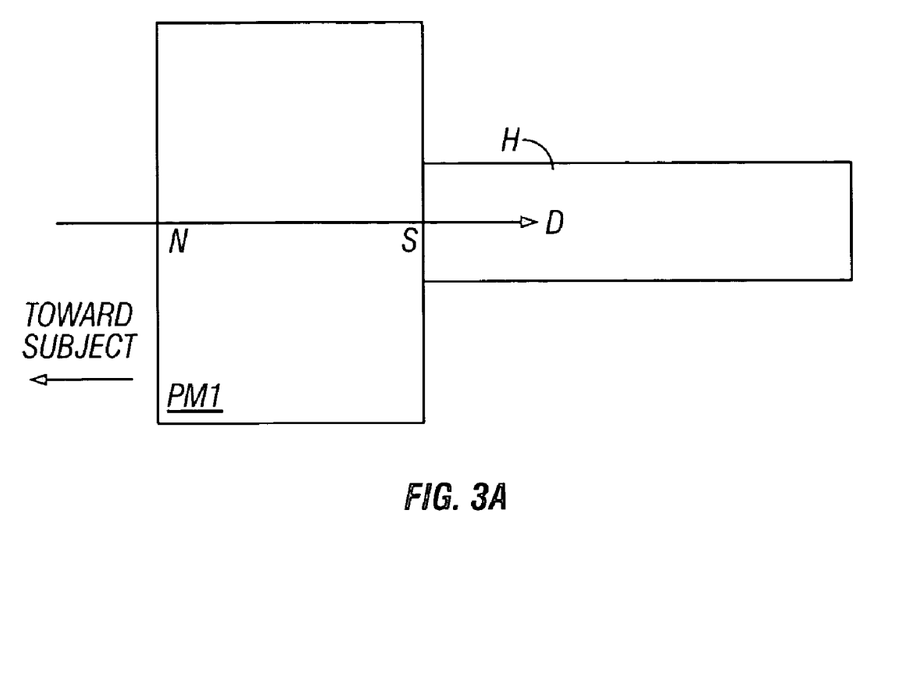
FIGS. 3A and 3B are elevation views of a first embodiment of hand held magnetizers according to the present invention.
Figure 3B:
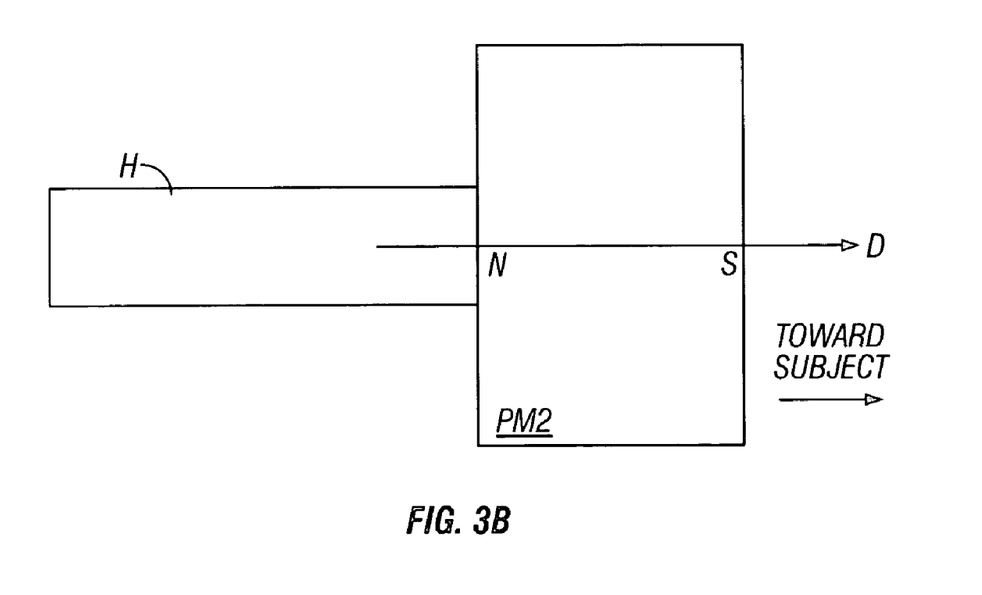

Preferably, for ease of use, the hand-held permanent magnet is attached to a non-ferromagnetic handle or, alternatively, to a non-ferromagnetic strap. FIGS. 3A and 3B show a first embodiment of the apparatus of the present invention, namely a pair of hand-held permanent magnets, each with a non-ferromagnetic handle H, made of a material such as plastic or aluminum. Such hand-held permanent magnets, when applied according to the method of the present invention, can be used to magnetize a portion of the subject in three (x, y, and z) axes.

A first hand-held magnet PM1, shown in FIG. 3A, is for use in magnetizing one side of the desired portion of the subject, such as the left side of the head. For purposes of clarity, it should be understood that the following discussion of the method assumes that the technician using the equipment is face-to-face with the subject to be scanned. Note that, if positioned for magnetizing the left side of the subject's head, the direction of magnetization of the magnet PM1 will be to the right as shown, with the handle H on the right. The hand-held magnet PM1 may also be used in magnetizing the back or the front of the desired portion of the subject, such as the back or front of the head, where appropriate. Note that if positioned for magnetizing the back of the subject's head, with the handle H extending away from the back of the subject's head, the direction of magnetization of the magnet PM1 will be into the page or away from the viewer. Finally, the first hand-held magnet PM1 may be used for magnetizing the top of the portion of the subject, where appropriate, such as the top of the head.

A second hand-held magnet PM2, shown in FIG. 3B, is for use in magnetizing the other side of the desired portion of the subject, such as the right side of the head in this example. Note that, if positioned for magnetizing the right side of the subject's head, the direction of magnetization of the magnet PM2 will also be to the right as shown, with the handle H on the left. This gives the magnet PM2 the same direction of magnetization, when applied to the right side of the subject's head, as the magnet PM1 has when applied to the left side of the subject's head. The hand-held magnet PM2 may also be used in magnetizing the front or the back of the desired portion of the subject, such as the front or the back of the head, where appropriate. Note that if positioned for magnetizing the front of the subject's head, with the handle H extending away from the subject's face, the direction of magnetization of the magnet PM2 will also be into the page or away from the viewer. This gives the magnet PM2 the same direction of magnetization, when applied to the front of the subject's head, as the magnet PM1 has when applied to the back of the subject's head. Finally, the first hand-held magnet PM1 may be used for magnetizing the top of the portion of the subject, where appropriate, such as the top of the head.

The directions of magnetization of the hand-held magnets can be reversed, as long as the left and right magnetization directions are the same as each other, and as long as the front and back magnetization directions are the same as each other.

A first magnet, such as the magnet PM1 shown in FIG. 3A, can be brought in next to the left side of the subject's head, along a substantially horizontal path. Compression of the hair may be required if the patient has a very large hair style. Movement of the magnet PM1 is substantially along the axis of the magnetic field generated by the magnet PM1, in a smooth deliberate motion, then back out along the same axis. Motion along this axis should be for as great a distance as conveniently practicable.

A systematic and orderly process is preferred, as are slow motions, because quick motions are more dangerous if, in fact, an intraocular foreign body, or a retained intracranial ferromagnetic object such as a ferromagnetic aneurysm clip, unknowingly happens to be present. Haphazard motions may also result in incomplete magnetization of a particular axis, and, potentially even worse, haphazard motions may result in demagnetization of a previously magnetized axis. The point is to be rational, diligent, and thorough in such a manner that no area of the target area is omitted from three-axis magnetic application.

The other magnet, such as the magnet PM2 shown in FIG. 3B, can be brought in next to the right side of the subject's head, along a substantially horizontal path, with the magnetic field axis of the second magnet PM2 substantially aligned with the path followed by the first magnet PM1, and with the path of the second magnet PM2 being substantially along the axis of the magnetic field generated by the magnet PM2. Here again, the movement should be a smooth deliberate motion, then back out along the same axis, with motion along this axis for as great a distance as conveniently practicable. The back side of the head area can be magnetized, moving a magnet along a substantially horizontal path in the same fashion, using either of the magnets PM1, PM2. If the front part of the head is to be magnetized, it should be magnetized in the same fashion, using the magnet which was not used for magnetizing the back of the head. Using different magnets on the left and right, or different magnets in the front and back, avoids a cancellation effect. The top side of the head area can be magnetized in the same fashion, moving either of the magnets PM1, PM2 downwardly along a substantially vertical path, and then back up, substantially along the axis of the magnetic field generated by the magnet. The order of performing these steps is not critical.

Because of the absence of hair on the front side of the head, however, as well as the desire to limit the magnetic field applied to the eye and the orbit areas, magnetization of the front side of the head is preferably accomplished primarily by the magnet magnetizing the back side of the head, rather than by applying magnetization directly to the front side of the head.

A magnetic field has now been applied to the hair and head area in all three axes. The subject is then scanned with a hand held wand, or passed through a scanning portal, as is known in the art. Magnetizing the pertinent portions of the subject prior to scanning has enhanced the possibility of detecting any magnetically hard threat objects which may be present in or on those portions of the subject.

An important consideration is that the direction of magnetization be the same for the magnet for the left side of the head and for the right side of the head, as this prevents a cancellation effect of the magnetic field which would occur if the directions of magnetization of these two magnets were opposite each other. Proper labeling of each permanent magnet and conscientious utilization of the magnets avoids confusion.

It should be noted that, strictly speaking, only one hand-held magnetizer is required to perform the method of the present invention. However, it is preferable not to rotate the hand-held permanent magnet after completion of magnetization of one side of the head area, when magnetizing the opposite side. So, having properly marked magnets for each side minimizes the chance for inadvertent rotation. For instance, if one magnet is used for opposite sides and rotated in between, the direction of magnetization will not be same for each side, but, rather, will be opposed, creating a null point. This situation is not as effective as when the direction of magnetization of the side magnets is the same.

Figure 4A:
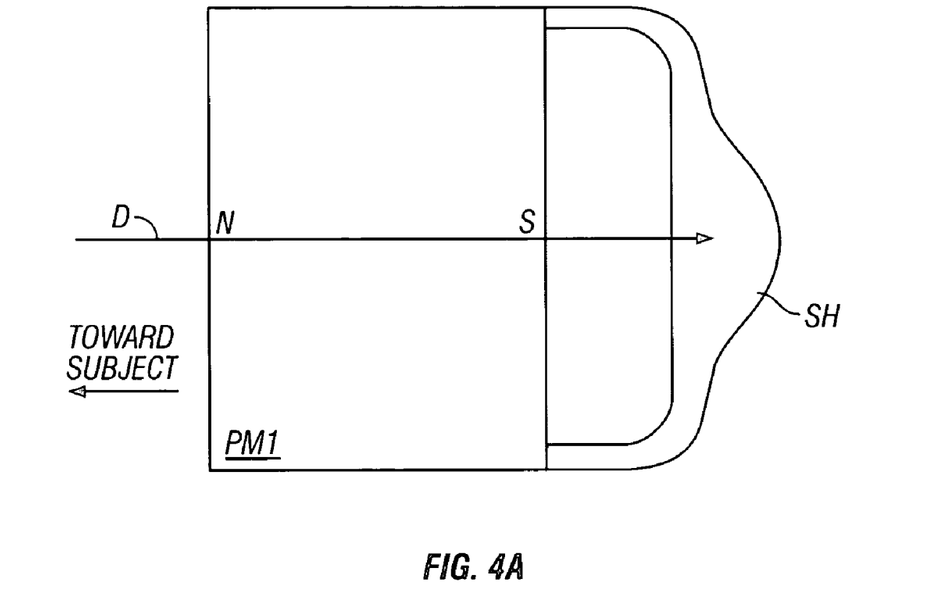
FIGS. 4A and 4B are elevation views of a second embodiment of hand held magnetizers according to the present invention.
Figure 4B:
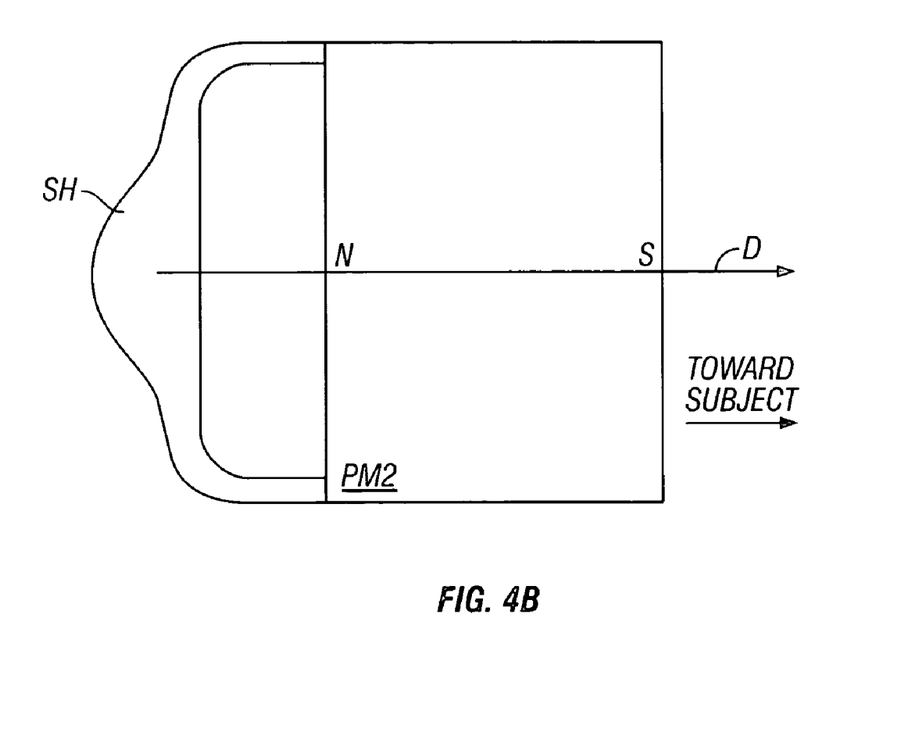

A non-ferromagnetic strap SH can be used to facilitate grasping of the permanent magnet in a second embodiment of the apparatus, shown in FIGS. 4A and 4B. The nonferromagnetic strap SH is substituted for the handle H and used in a similar manner as that described for usage of a permanent magnet attached to the handle H.

Figure 5A:
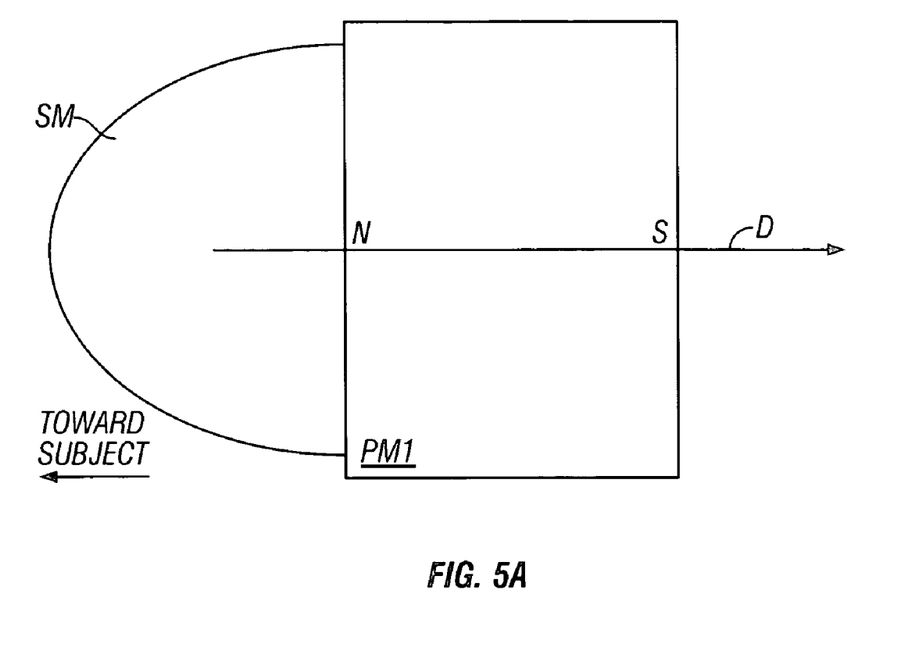
FIGS. 5A and 5B are elevation views of a third embodiment of hand held magnetizers according to the present invention.
Figure 5B:
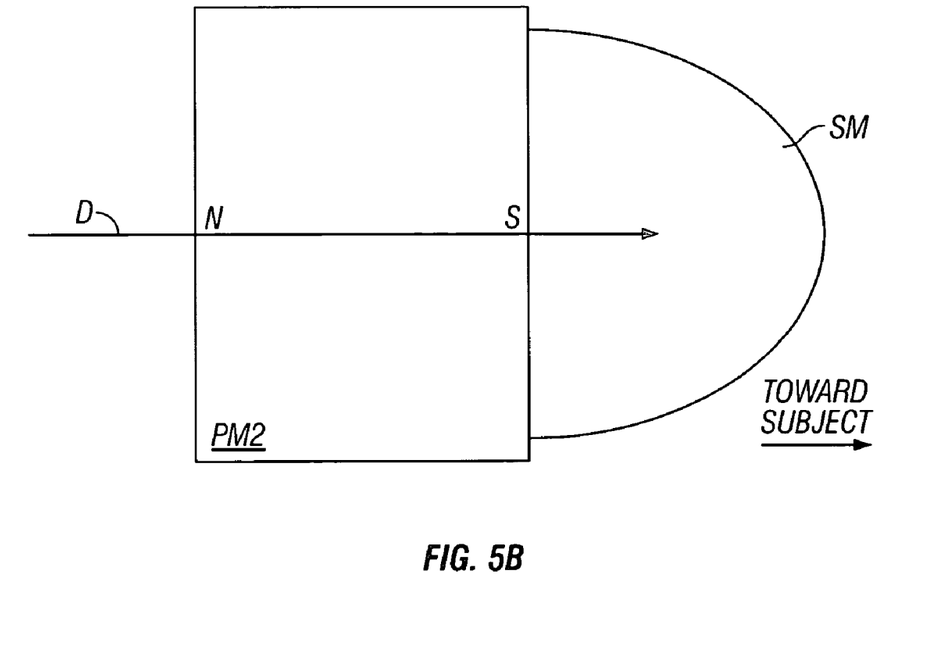

It can also be helpful, in some applications, to attach a soft material SM, such as a sponge-like foam, to the front side of each hand-held permanent magnet, as shown in the third embodiment of FIGS. 5A and 5B. This can prevent banging the subject's head, for instance. The sponge-like material SM can also provide the desired separation between the permanent magnet and the subject, so that the applied magnetic field to the subject is not excessively high. For instance, if one desires to magnetize the front part of the head area, an excessively large magnetic field could be inadvertently applied too closely to the eye area, which could be a problem if an occult ferromagnetic foreign body were present.

Figure 6:
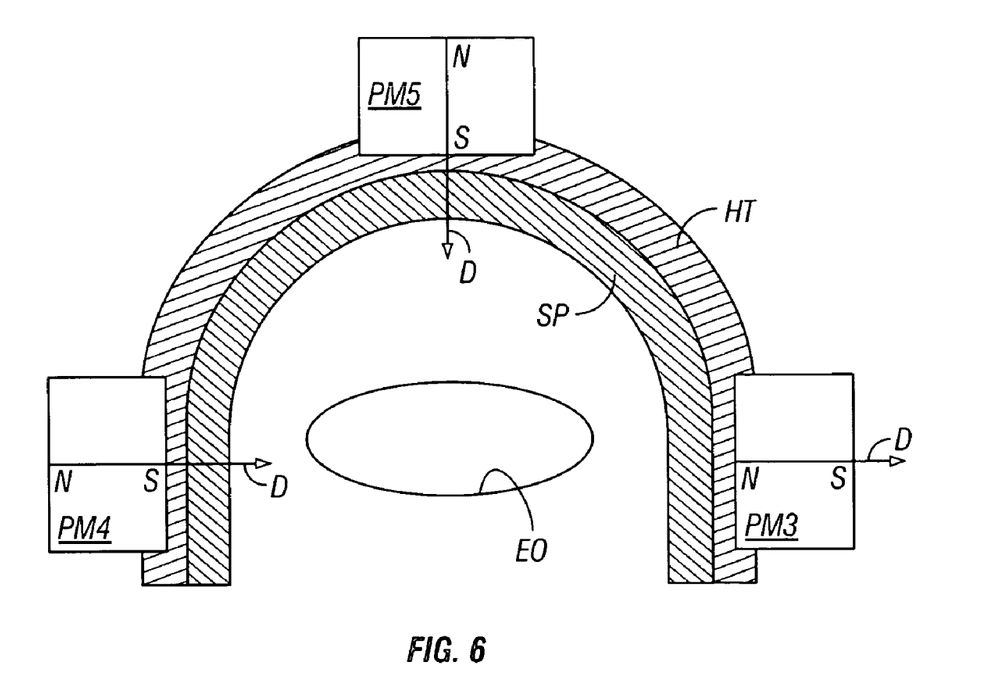
FIG. 6 is a section view of a fourth embodiment of a helmet magnetizer according to the present invention.

A fourth embodiment, shown in FIG. 6, is a helmet-like configuration constructed of a non-ferromagnetic material, such as plastic or aluminum, with permanent magnets attachable thereto. The subject's head is placed within the helmet HT, so as to achieve magnetization of any threat objects which may be present on the head, including bobby pins and the like. Within the helmet HT can be a non-ferromagnetic spacer SP, which not only protects the head of the subject, but also separates the magnets PM3, PM4, PM5 from the head at the appropriate distance of approximately 0.75 to 1.25 inches. This spacing yields the preferred applied magnetic field of approximately 50 to 200 Oe to the hair and the surface of the head area.

In the helmet embodiment, a first permanent magnet PM3 is attached to the exterior of the helmet HT on one side, and a second permanent magnet PM4 is attached on the opposite side of the helmet HT. These two permanent magnets PM3, PM4 are oriented in such a manner that the direction of magnetization is the same for each magnet. If they were to be mounted with opposing fields, there would be a null point in the center, which is undesirable. A third magnet PM5 is mounted on the top of the helmet HT, with a vertical direction of magnetization. It can be helpful to have an opening EO on the helmet for the subject's eyes, to minimize claustrophobia.

The preferred method with this helmet configuration is to place the helmet HT on the subject's head substantially along a vertical path, using a smooth motion. With the helmet HT now on the head, the helmet HT is rotated in a smooth and controlled fashion by 90 degrees. The helmet HT is then removed smoothly from the subject's head substantially along a vertical path. Using this method, three axis magnetization has now been achieved.

As an alternative to the embodiment shown, a greater array of permanent magnets can be arranged circumferentially around the helmet, as well as placing more than one permanent magnet on the top of the helmet. The same method described above would be followed to achieve three axis magnetization. This embodiment is not preferred, because of potential cancellation of one magnet's magnetic field by another.

Figure 7:
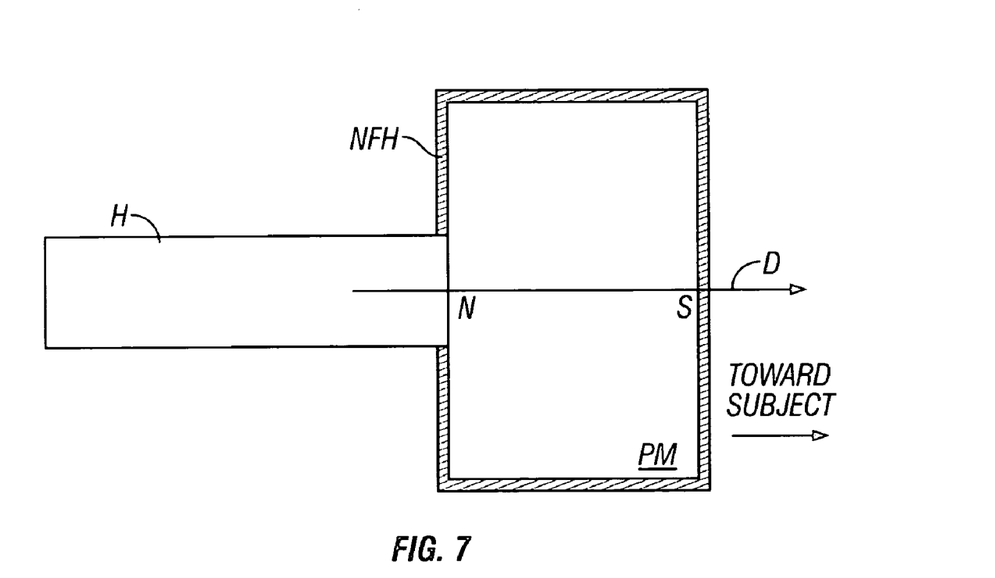
FIG. 7 is a section view of a fifth embodiment of a hand held magnetizer according to the present invention.

In a fifth embodiment, shown in FIG. 7, the permanent magnet PM can be mounted in a non-ferromagnetic housing NFH, such as a housing of aluminum, for protection. It can have a handle to form a magnetizer wand, or it can be attached to a non-ferromagnetic strap which is suitable for easy grasping, as described above.

It is important that the magnetizer of the present invention not be excessively strong. For instance, a wand of 3,000 to 4,000 Oe would certainly accomplish the task of magnetization, but, if the patient were to have a retained intraocular ferromagnetic foreign body, a field of 3,000 to 4,000 Oe, or even less, might cause this object to move. This could have catastrophic consequences, such as retinal hemorrhage and even blindness. The strength of the magnetizer must be sufficient to magnetize even difficult-to-magnetize ferromagnetic threat objects, but, at the same time, risk to the person being screened from the magnetizer itself must be carefully weighed. A magnetizing field much above 800 to 1,000 Oe is unreasonable from the safety point of view, and unnecessary for the purpose of magnetizing small magnetically hard threat objects.

The preferred magnetic field strength, for either the hand-held permanent magnet configuration or the helmet configuration of the present invention, is in the range of 50 to 200 Oe. The preferred distance from the hand-held magnet to the head or other body portion is approximately 2 to 3 inches. The helmet configuration preferably places the magnets closer to the head, at approximately 0.75 to 1.25 inches.

While the particular invention as herein shown and disclosed in detail is fully capable of obtaining the objects and providing the advantages hereinbefore stated, it is to be understood that this disclosure is merely illustrative of the presently preferred embodiments of the invention and that no limitations are intended other than as described in the appended claims.

We claim:

1. A method for enhancing the magnetization of a subject to be scanned for localized magnetic fields indicating the presence of ferromagnetic threat objects, the enhancement method comprising:
    providing at least one magnet generating at least one magnetic field having an axis;
    orienting said axis of said at least one magnetic field in at least one selected direction relative to a subject to be scanned; and
    positioning said at least one magnet in close proximity to at least one portion of said subject to be scanned, to thereby magnetize any ferromagnetic threat object which may be present on said at least one portion of said subject, prior to scanning said subject.

2. The method recited in claim 1, further comprising orienting said axis of said at least one magnetic field in three mutually orthogonal selected directions.

3. The method recited in claim 1, further comprising moving said at least one magnet toward and away from said at least one portion of said subject to be scanned, along a path substantially parallel with said axis of said at least one magnetic field.

4. The method recited in claim 1, further comprising:
    positioning said at least one magnet on two opposite sides of said at least one portion of said subject to be scanned; and
    orienting said axis of said at least one magnetic field in substantially the same selected direction on both said opposite sides of said at least one portion of said subject to be scanned.

5. The method recited in claim 1, further comprising providing said at least one magnet with a field strength of between 50 and 200 Oe.

6. The method recited in claim 1, further comprising positioning said at least one magnet between 0.75 and 3 inches from said at least one portion of said subject to be scanned.

7. The method recited in claim 1, further comprising:
   providing first and second said magnets, each said magnet generating a magnetic field having an axis;
   positioning said first magnet on a first side of said at least one portion of said subject to be scanned;
   positioning said second magnet on a second side of said at least one portion of said subject to be scanned, said second side being opposite said first side; and
   orienting said axes of said magnetic fields in substantially the same selected direction on both said opposite sides of said at least one portion of said subject to be scanned.

8. A method for enhancing the magnetization of a subject to be scanned for localized magnetic fields indicating the presence of ferromagnetic threat objects, the enhancement method comprising:
   providing at least one magnet, each said magnet generating a magnetic field having an axis;
   positioning said at least one magnet in a first position in close proximity to at least one portion of a subject to be scanned;
   orienting said axis of said magnetic field of said at least one magnet in a first selected direction, in said first position;
   positioning said at least one magnet in a second position in close proximity to said at least one portion of a subject to be scanned;
   orienting said axis of said magnetic field of said at least one magnet in a second selected direction orthogonal to said first selected direction, in said second position;
   positioning said at least one magnet in a third position in close proximity to said at least one portion of a subject to be scanned; and
   orienting said axis of said magnetic field of said at least one magnet in a third selected direction orthogonal to said first and second selected directions, in said third position;
   thereby magnetizing any ferromagnetic threat object present, along said three mutually orthogonal selected directions, prior to scanning said subject.

* * * * *